(12) United States Patent
Wang et al.

(10) Patent No.: US 8,387,239 B2
(45) Date of Patent: Mar. 5, 2013

(54) MANUFACTURING METHOD OF EMBEDDED CIRCUIT SUBSTRATE

(75) Inventors: Chien-Hao Wang, Hsinchu County (TW); Ming-Chiang Lee, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 468 days.

(21) Appl. No.: 12/622,052

(22) Filed: Nov. 19, 2009

(65) Prior Publication Data

US 2010/0139965 A1 Jun. 10, 2010

(30) Foreign Application Priority Data

Dec. 9, 2008 (TW) .............................. 97147880 A

(51) Int. Cl.
*H05K 3/02* (2006.01)
*H05K 3/10* (2006.01)

(52) U.S. Cl. .............. 29/846; 29/830; 29/831; 156/247; 174/262

(58) Field of Classification Search .................... 29/830, 29/831, 846, 848, 850, 851; 156/150, 154, 156/247; 174/255, 262; 205/78, 125; 430/313, 430/315; 438/637, 667

See application file for complete search history.

(56) References Cited

U.S. PATENT DOCUMENTS

| | | | | |
|---|---|---|---|---|
| 4,306,925 | A * | 12/1981 | Lebow et al. | 29/848 |
| 6,558,780 | B2 * | 5/2003 | Suzuki et al. | 174/264 |
| 7,080,446 | B2 * | 7/2006 | Baba et al. | 29/852 |
| 2009/0038837 | A1 | 2/2009 | Okabe et al. | |

OTHER PUBLICATIONS

"1st Office Action of China Counterpart Application", issued on Nov. 7, 2011, p. 1-p. 4.

* cited by examiner

*Primary Examiner* — Donghai D. Nguyen
(74) *Attorney, Agent, or Firm* — J.C. Patents

(57) ABSTRACT

An embedded circuit substrate comprising: a core structure having a first surface and a second surface opposite to each other; a first patterned conductive layer disposed on the first surface and embedded in the core structure; a second patterned conductive layer disposed on the second surface and embedded in the core structure; and a plurality of conductive blocks disposed in the core structure for conducting the first patterned conductive layer and the second patterned conductive layer is provided. Furthermore, a manufacturing method of an embedded circuit substrate is also provided.

15 Claims, 5 Drawing Sheets

MANUFACTURING METHOD OF EMBEDDED CIRCUIT SUBSTRATE

CROSS-REFERENCE TO RELATED APPLICATION

This application claims the priority benefit of Taiwan application serial no. 97147880, filed on Dec. 9, 2008. The entirety of the above-mentioned patent application is hereby incorporated by reference herein and made a part of this specification.

BACKGROUND OF THE INVENTION

1. Field of the Invention

The present invention generally relates to a circuit substrate and a manufacturing method thereof. More particularly, the present invention relates to an embedded circuit substrate and a manufacturing method thereof.

2. Description of Related Art

In semiconductor package, circuit substrate is one of the packaging devices in common use. The circuit substrate is constituted by patterned conductive layers and dielectric layers interlaced to each other, wherein two circuit layer are electrically connected through conductive vias. However, with the improvement of integrity and flatness, the conventional structure and manufacturing process of circuit substrate are no longer sufficient for use. Thus, a circuit substrate with an embedded circuit is developed.

SUMMARY OF THE INVENTION

Accordingly, the present invention is directed to an embedded circuit substrate having a flat surface.

The present invention is directed to a manufacturing method of an embedded circuit substrate having a flat surface.

As embodied and broadly described herein, the present invention provides an embedded circuit substrate comprising: a core structure, having a first surface and a second surface opposite to each other; a first patterned conductive layer, disposed on the first surface and embedded in the core structure; a second patterned conductive layer, disposed on the second surface and embedded in the core structure; and a plurality of conductive blocks, disposed in the core structure for conducting the first patterned conductive layer and the second patterned conductive layer.

The present invention also provides a manufacturing method of embedded circuit substrate, comprising: providing a core structure having a first surface and a second opposite to each other; providing a first conductive laminated structure, wherein the first conductive laminated structure comprises a first metal layer and a first patterned conductive layer disposed on the first metal layer; providing a second conductive laminated structure, wherein the second conductive laminated structure comprises a second metal layer and a second patterned conductive layer disposed on the second metal layer; laminating the first conductive laminated structure and the second conductive laminated structure to the core structure, wherein the first patterned conductive layer is embedded in the first surface of the core structure, and the second patterned conductive layer is embedded in the second surface of the core structure; forming a plurality of first conductive blocks in the core structure, wherein the first patterned conductive layer and the second patterned conductive layer are conducted via the first conductive blocks; and removing the first metal layer and the second metal layer.

Accordingly, the patterned conductive layers and the conductive blocks are embedded into the corresponding dielectric layers at the same time by laminating such that the embedded circuit substrate has a flat surface.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
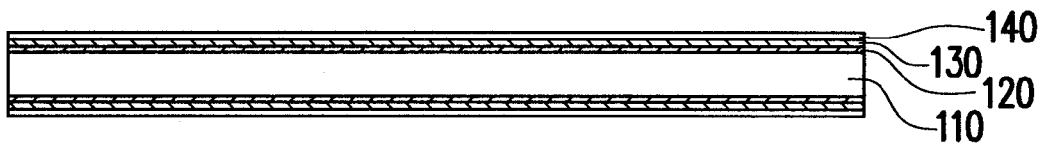
FIGS. 1A to 1L are cross-sectional views showing a manufacturing process according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1L are cross-sectional views showing a manufacturing process according to an embodiment of the present invention. First, referring to FIG. 1A, a sacrifice layer 110, two third metal layers 120 disposed on two opposite surfaces of the sacrifice layer 110 and two first metal layers 130 disposed on the two third metal layers 120 are provided. Each third metal layer 120 is located between the sacrifice layer 110 and the corresponding first metal layer 130. In this embodiment, a first etching stopping layer 140 can be further formed on each first metal layer 130.

Figure 1B:
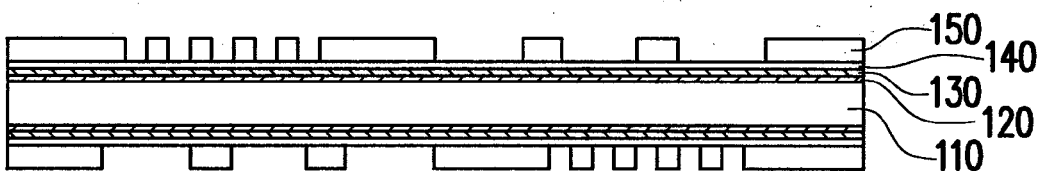

Next, referring to FIG. 1B, a first mask layer 150 is formed on each first etching stopping layer 140, wherein each first metal layer 130 is located between the corresponding third metal layer 120 and the corresponding first mask layer 150, and each first mask layer 150 exposes a part of the first metal layer 130.

Figure 1C:
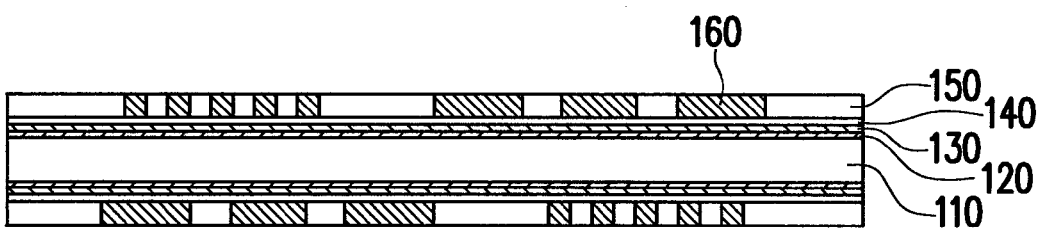
Figure 1D:
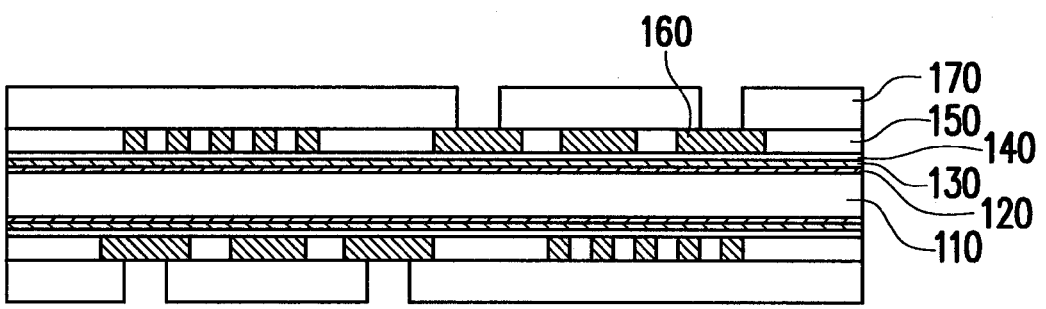

Next, referring to FIG. 1C, a first patterned conductive layer 160 is formed on the part of the first metal layer 130 exposed by each first mask layer 150. The method of forming the first patterned conductive layers 160 can be electroplating. Then, referring to FIG. 1D, a second mask layer 170 is formed on each first mask layer 150, wherein each second mask layer 170 exposes a part of the corresponding first patterned conductive layer 160.

Figure 1E:
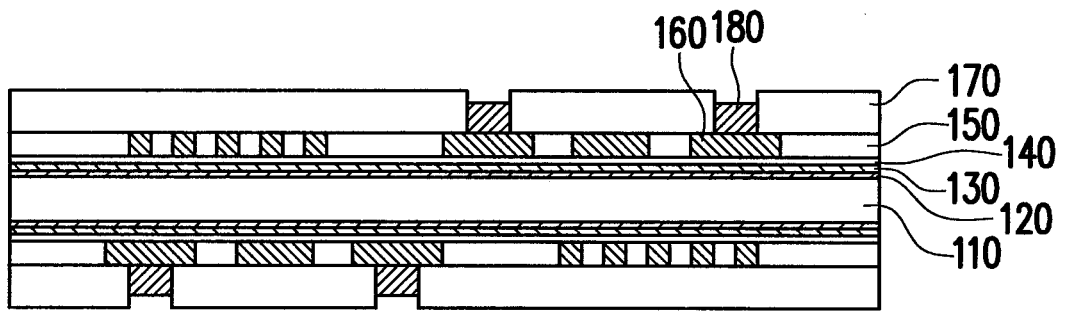
Figure 1F:
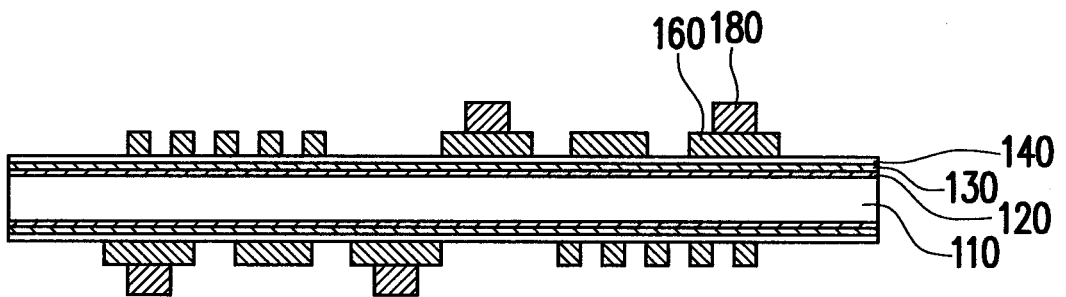
Figure 1G:
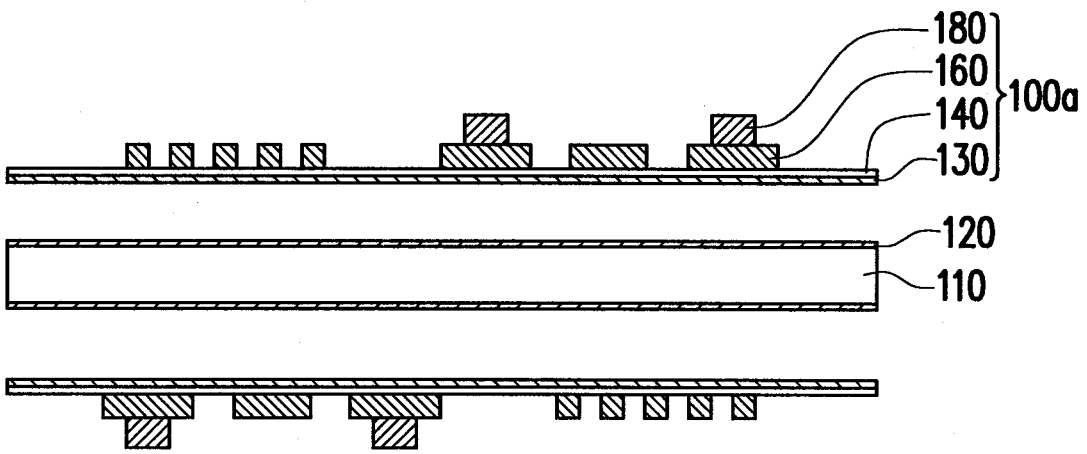

Next, referring to FIG. 1E, a plurality of first conductive blocks 180 are formed on the part of the first patterned conductive layer 160 exposed by each second mask layer 170. Then, referring to FIG. 1F, each second mask layer 170 and each first mask layer 150 are removed. Then, referring to FIG. 1G, each third metal layer 120 and the sacrifice layer 110 are removed to obtain two first conductive laminated structures 100a.

It should noted that each first conductive laminated structure 100a comprises a first metal layer 130, a first patterned conductive layer 160, a plurality of first conductive blocks 180 and a first etching stopping layer 140. Furthermore, in this embodiment, the method of removing the sacrifice layer 110 and each third metal layer 120 can be peeling each third metal layer 120 from the corresponding first metal layer 130.

Figure 1H:
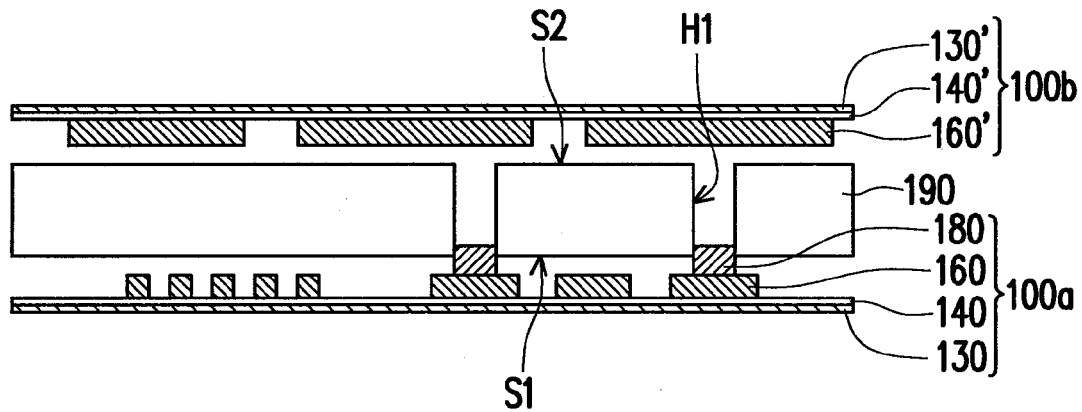

Next, referring to FIG. 1H, a first dielectric layer 190 and a second conductive laminated structure 100b are provided. The first dielectric layer 190 has a first surface Si and a second surface S2 opposite to each. The second conductive laminated structure 100b comprises a second metal layer 130', a second patterned conductive layer 160' and a second etching stopping layer 140' disposed between the second metal layer 130' and the second patterned conductive layer 160'. It should be noted that the manufacturing method of the second conductive laminated structure 100b is similar to that of the first conductive laminated structure 100a and is not repeated herein.

Figure 1I:
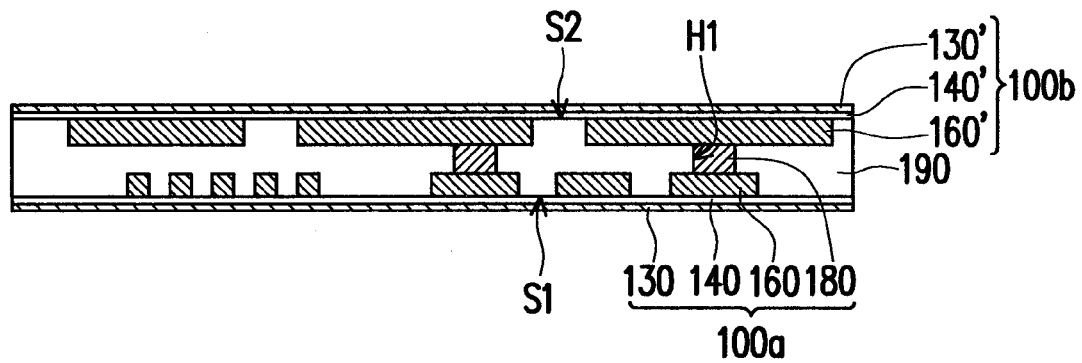

Next, referring to FIG. 1I, the first conductive laminated structure 100a and the second conductive laminated structure 100b are laminated to the first dielectric layer 190 so that the first patterned conductive layer 160 and the first conductive blocks 180 are embedded in the first surface Si of the first dielectric layer 190 and the second patterned conductive layer 160' is embedded in the second surface S2 of the first dielectric layer 190. The first patterned conductive layer 160 and the second patterned conductive layer 160' are conducted via the first conductive blocks 180.

The first dielectric layer 190 has a plurality of first through holes H1 for containing the first conductive blocks 180. It should be noted that the first through holes H1 in the first dielectric layer 190 can be formed by embedding the conductive blocks 180 into the first dielectric layer 190 or can be formed in advance.

More particularly, a surface roughening on the first conductive blocks 180, the first patterned conductive layer 160 and the second patterned conductive layer 160' can be conducted before embedding the first conductive laminated structure 100a and the second conductive laminated structure 100b to the first dielectric layer 190 to improve the bonding force of the first conductive blocks 180, the first patterned conductive layer 160 and the second patterned conductive layer 160' to the first dielectric layer 190.

Figure 1J:
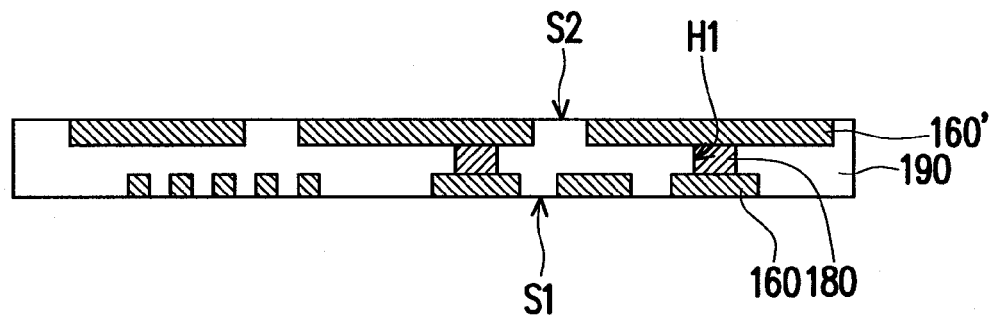

Next, referring to FIG. 1J, the first metal layer 130, the second metal layer 130', the first etching stopping layer 140 and the second etching stopping layer 140' are removed by etching. Specifically, the etchant applied on the first etching stopping layer 140 and the second etching stopping layer 140' is different from that applied on the first metal layer 130, the second metal layer 130', the first patterned conductive layer 160 and the second patterned conductive layer 160'. Therefore, over-etching to the first patterned conductive layer 160 and the second patterned conductive layer 160' can be avoided when etching the first metal layer 130 and the second metal layer 130'.

Figure 1K:
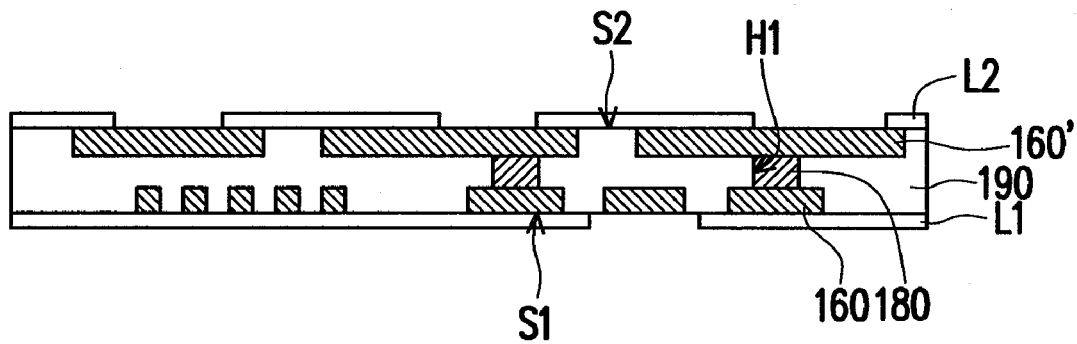

Next, referring to FIG. 1K, a first solder mask layer L1 and a second solder mask layer L2 are respectively formed on the first patterned conductive layer 160 and the second patterned conductive layer 160'. The first solder mask layer L1 and the second solder mask layer L2 respectively expose a part of the first patterned conductive layer 160 and a part of the second patterned conductive layer 160'.

Figure 1L:
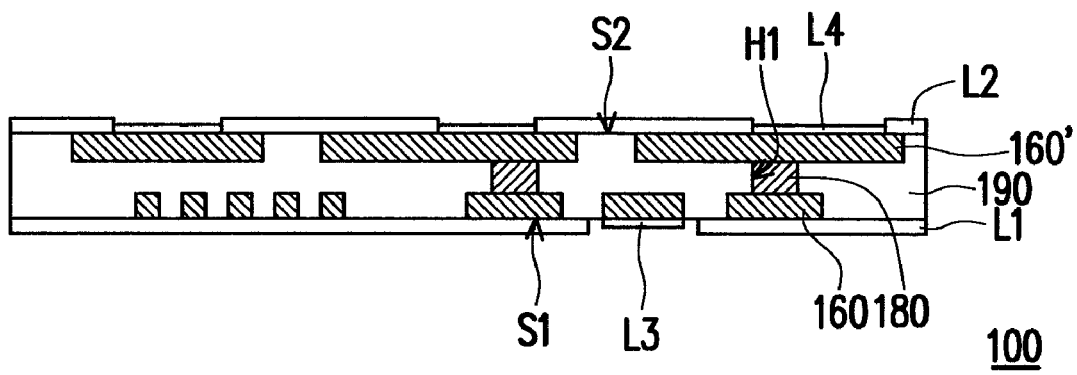

Next, referring to FIG. 1L, in this embodiment, a first anti-oxidation layer L3 and a second anti-oxidation layer L4 can be further formed on the part of the first patterned conductive layer 160 exposed by the first solder mask layer L1 and the part of the second patterned conductive layer 160' exposed by the second solder mask layer L2, respectively. The method of forming the first anti-oxidation layer L3 and the second anti-oxidation layer L4 can be electroplating.

Referring to FIG. 1L, the embedded circuit substrate 100 of this embodiment comprises a first dielectric layer 190, a first patterned conductive layer 160, a second patterned conductive layer 160', a plurality of first conductive blocks 180, a first solder mask layer L1, a second solder mask layer L2, a first anti-oxidation layer L3 and a second anti-oxidation layer L4.

The first dielectric layer 190 has a first surface S1 and a second surface S2 opposite to each other. The first patterned conductive layer 160 is disposed on the first surface S1 and embedded in the first dielectric layer 190. The second patterned conductive layer 160' is disposed on the second surface S2 and embedded in the first dielectric layer 190. The first conductive blocks 180 are disposed in the first dielectric layer 190 for conducting the first patterned conductive layer 160 and the second patterned conductive layer 160'.

The first solder mask layer L1 and the second solder mask layer L2 are respectively disposed on the first patterned conductive layer 160 and the second patterned conductive layer 160' for respectively exposing a part of the first patterned conductive layer 160 and a part of the second patterned conductive layer 160'. The first anti-oxidation layer L3 and the second anti-oxidation layer L4 are respectively disposed on the part of the first patterned conductive layer 160 exposed by the first solder mask layer L1 and the part of the second patterned conductive layer 160' exposed by the second solder mask layer L2.

Figure 2A:
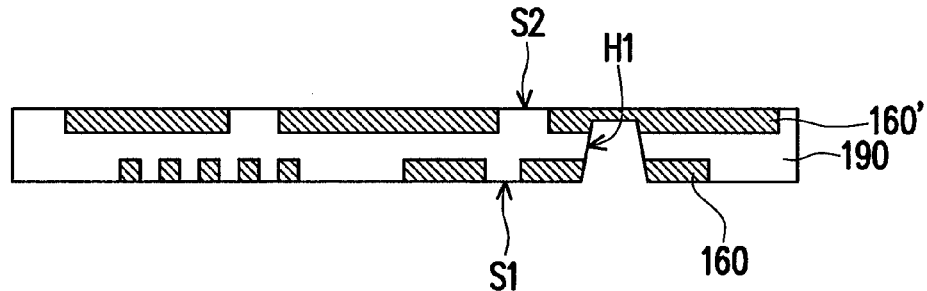
FIGS. 2A and 2B are cross-sectional views showing a manufacturing process according to another embodiment of the present invention.
Figure 2B:
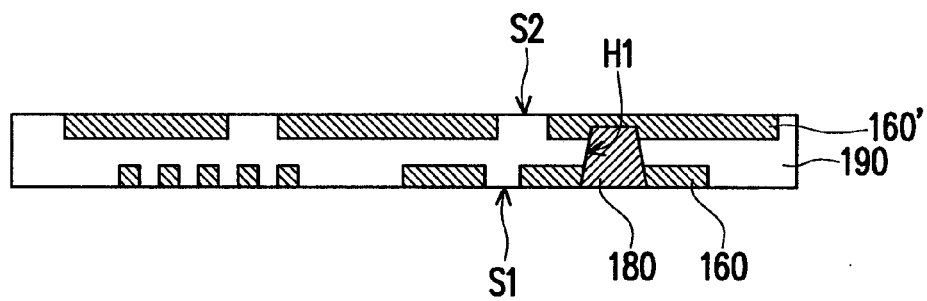

However, the aforementioned first conductive blocks 180 can further be formed by another method. FIGS. 2A and 2B are cross-sectional views showing a manufacturing process according to another embodiment of the present invention. Comparing with the manufacturing method of the embedded circuit substrate of FIG. 1I, the first conductive blocks 180 of this embodiment are not formed until the first conductive laminated structure 100a and the second conductive laminated structure 100b are laminated to the first dielectric layer 190.

Referring to FIG. 2A, after laminating the first conductive laminated structure 100a as shown in FIG. 1I but without the first conductive blocks 180 and the second conductive laminated structure 100b as shown in FIG. 1I to the first dielectric layer 190, and after removing the first metal layer 130, the second metal layer 130', the first etching stopping layer 140 and the second etching stopping layer 140', first through holes H1 are formed in the first dielectric layer 190 by a laser. Then, referring to FIG. 2B, the first conductive blocks 180 are formed in the first through holes H1 by electroplating or filling a conductive paste to obtain a structure similar to that of FIG. 1J, and the manufacturing process as shown in FIGS. 1K and 1L can therefore be performed sequentially.

Figure 3:
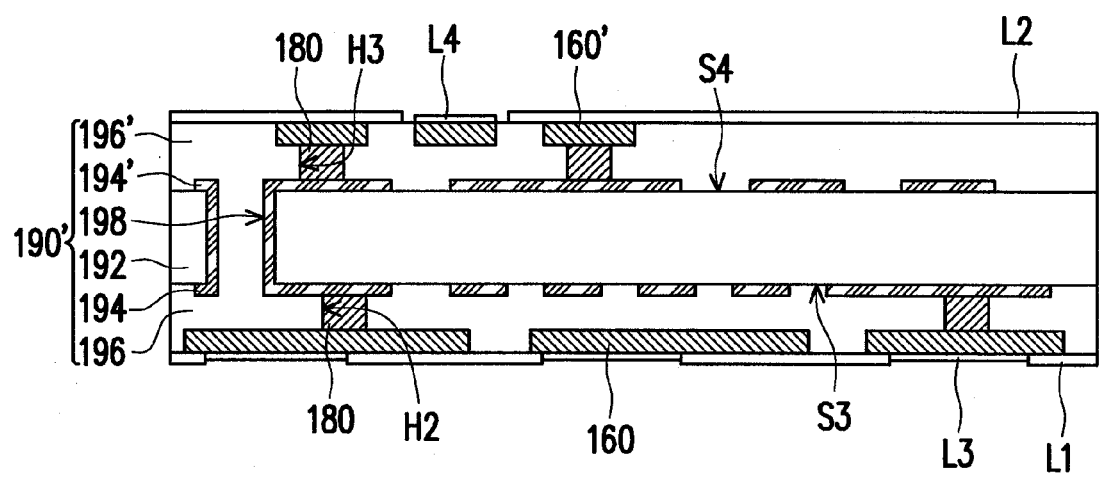
FIG. 3 is a cross-sectional view showing an embedded circuit substrate according to further another embodiment of the present invention.

FIG. 3 is a cross-sectional view showing an embedded circuit substrate according to further another embodiment of the present invention. Referring to FIG. 3, comparing with the embedded circuit substrate 100 of FIG. 1L, the embedded circuit substrate 100' of this embodiment has a core structure 190' instead of the first dielectric layer 190 of FIG. 1L. The core structure 190' comprises a core dielectric layer 192, a third patterned conductive layer 194, a fourth patterned conductive layer 194', a second dielectric layer 196, a third dielectric layer 196' and at least one conductive via 198.

The core dielectric layer 192 has a third surface S3 and a fourth surface S4 opposite to each other. The third patterned conductive layer 194 is disposed on the third surface S3. The fourth patterned conductive layer 194' is disposed on the fourth surface S4. The second dielectric layer 196 is disposed on the third patterned conductive layer 194, wherein the third patterned conductive layer 194 is located between the second dielectric layer 196 and the core dielectric layer 192, and the first conductive blocks 180 are located in the second dielectric layer 196 for connecting the first patterned conductive layer 160 and the third patterned conductive layer 194. The second dielectric layer 196 has a plurality of second through holes H2 for containing the first conductive blocks 180. The third dielectric layer 196' is disposed on the fourth patterned conductive layer 194', wherein the fourth patterned conductive layer 194' is located between the third dielectric layer 196' and the core dielectric layer 192. The conductive via 198 is located in the core dielectric layer 192 for conducting the third patterned conductive layer 194 and the fourth patterned conductive layer 194'.

Comparing with the embedded circuit substrate 100 of FIG. 1L, the embedded circuit substrate 100' of this embodiment further comprises a plurality of second conductive blocks 180' disposed on the second patterned conductive layer 160' and located in the third dielectric layer 196' for connecting the second patterned conductive layer 160' and the fourth patterned conductive layer 194'. The third dielectric layer 196' has a plurality of third through holes H3 for containing the second conductive blocks 180'. Furthermore, in this embodiment, the first patterned conductive layer 160 is embedded in the second dielectric layer 196 and the second patterned conductive layer 160' is embedded in the third dielectric layer 196'. It should be noted that the manufacturing method of the embedded circuit substrate 100' of this embodiment is similar to that of the embedded circuit substrate 100 of FIG. 1L and is not repeated herein.

In summary, the present invention embedding the patterned conductive layer and the conductive via in the dielectric layer at the same time by laminating such that the embedded circuit substrate has flat surface. Additionally, an embedded circuit substrate with a core dielectric layer in superior structural strength or another embedded circuit substrate without any core dielectric layer in lower thickness can be provided in the present invention according to different requirements.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of embedded circuit substrate, comprising:
    providing a core structure having a first surface and a second opposite to each other;
    providing a first conductive laminated structure having a first metal layer and a first patterned conductive layer disposed on the first metal layer, comprising:
    providing a sacrifice layer, a third metal layer disposed on the sacrifice layer and the first metal layer disposed on the third metal layer, wherein the third metal layer is located between the sacrifice layer and the first metal layer;
    forming a first mask layer on the first metal layer, wherein the first metal layer is located between the third metal layer and the first mask layer, and the first mask layer exposes a part of the first metal layer;
    forming the first patterned conductive layer on the part of the first metal layer exposed by the first mask layer;
    forming a second mask layer on the first mask layer, wherein the second mask layer exposes a part of the first patterned conductive layer;
    forming a plurality of first conductive blocks on the part of the first patterned conductive layer exposed by the second mask layer;
    removing the second mask layer and the first mask layer; and
    removing the third metal layer and the sacrifice layer;
    providing a second conductive laminated structure, wherein the second conductive laminated structure comprises:
    a second metal layer; and
    a second patterned conductive layer, disposed on the second metal layer;
    laminating the first conductive laminated structure and the second conductive laminated structure to the core structure and embedding the first conductive blocks into the core structure when laminating the first conductive laminated structure and the second conductive laminated structure to the core structure, wherein the first patterned conductive layer is embedded in the first surface of the core structure, and the second patterned conductive layer is embedded in the second surface of the core structure
    wherein the first patterned conductive layer and the second patterned conductive layer are conducted via the first conductive blocks; and
    removing the first metal layer and the second metal layer.

2. The manufacturing method of embedded circuit substrate according to claim 1, wherein the method of removing the first metal layer and the second metal layer comprises etching.

3. The manufacturing method of embedded circuit substrate according to claim 2, wherein the manufacturing method of the first conductive laminated structure further comprises:
    forming a first etching stopping layer on the first metal layer before forming the first mask layer on the first metal layer.

4. The manufacturing method of embedded circuit substrate according to claim 1, wherein the core structure comprises a first dielectric layer.

5. The manufacturing method of embedded circuit substrate according to claim 4, wherein the first dielectric layer has a plurality of first through holes for containing the first conductive blocks.

6. The manufacturing method of embedded circuit substrate according to claim 1, further comprising:
    forming a first solder mask layer on the first patterned conductive layer, wherein the first solder mask layer exposes a part of the first patterned conductive layer.

7. The manufacturing method of embedded circuit substrate according to claim 6, further comprising:
    forming a first anti-oxidation layer on the part of the first patterned conductive layer exposed by the first solder mask layer.

8. The manufacturing method of embedded circuit substrate according to claim 1, further comprising:
    forming a second solder mask layer on the second patterned conductive layer, wherein the second solder mask layer exposes a part of the second patterned conductive layer.

9. The manufacturing method of embedded circuit substrate according to claim 8, further comprising:
    forming a second anti-oxidation layer on the part of the second patterned conductive layer exposed by the second solder mask layer.

10. The manufacturing method of embedded circuit substrate according to claim 1, further comprising:
    performing a surface roughening to the first conductive block, the first patterned conductive layer and the second patterned conductive layer before laminating the first conductive laminated structure and the second conductive laminated structure to the core structure.

11. The manufacturing method of embedded circuit substrate according to claim 1, wherein the method of removing the sacrifice layer and the third metal layer comprises:
    peeling the third metal layer from the first metal layer.

12. The manufacturing method of embedded circuit substrate according to claim 1, wherein the core structure comprises:
    a core dielectric layer, having a third surface and a fourth surface opposite to each other;
    a third patterned conductive layer, disposed on the third surface;
    a fourth patterned conductive layer, disposed on the fourth surface;
    a second dielectric layer, disposed on the third patterned conductive layer, wherein the third patterned conductive layer is located between the second dielectric layer and the core dielectric layer, and an outermost surface of the second dielectric layer is the first surface of the core structure;
    a third dielectric layer, disposed on the fourth patterned conductive layer, wherein the fourth patterned conductive layer is located between the third dielectric layer and the core dielectric layer, and an outermost surface of the third dielectric layer is the second surface of the core structure; and
    at least one conductive via, located in the core dielectric layer for conducting the third patterned conductive layer and the fourth patterned conductive layer.

13. The manufacturing method of embedded circuit substrate according to claim 12, wherein the second dielectric layer has a plurality of second through holes for containing the first conductive blocks.

14. The manufacturing method of embedded circuit substrate according to claim 12, wherein the second conductive laminated structure further comprises:
    a plurality of second conductive blocks, disposed on the second patterned conductive layer, wherein the second conductive blocks are embedded into the core structure when the second patterned conductive layer is embedded in the second surface of the core structure.

15. The manufacturing method of embedded circuit substrate according to claim 14, wherein the third dielectric layer has a plurality of third through hole for containing the second conductive blocks.

* * * * *